April 18, 1961

M. C. STEELE

SWITCHING CIRCUIT COMPRISING TEMPERATURE CONTROLLED SEMICONDUCTIVE DEVICE 2,980,808

Filed Nov. 20, 1957

2 Sheets-Sheet 1

INVENTOR.
MARTIN C. STEELE
BY
Charles H. Brown
ATTORNEY

April 18, 1961 M. C. STEELE 2,980,808

SWITCHING CIRCUIT COMPRISING TEMPERATURE CONTROLLED SEMICONDUCTIVE DEVICE

Filed Nov. 20, 1957 2 Sheets-Sheet 2

INVENTOR.
MARTIN C. STEELE
BY
Charles H. Brown
ATTORNEY

United States Patent Office 2,980,808

Patented Apr. 18, 1961

2,980,808

SWITCHING CIRCUIT COMPRISING TEMPERATURE CONTROLLED SEMICONDUCTIVE DEVICE

Martin C. Steele, Princeton, N.J., assignor to Radio Corporation of America, a corporation of Delaware Filed Nov. 20, 1957, Ser. No. 697,550

19 Claims. (Cl. 307—88.5)

The invention relates to switching circuits and particularly to a switching circuit including a body of semiconductive material which exhibits a sharp change in resistivity due to impact ionization under predetermined conditions of temperature and applied electric field.

An object of the invention is to provide an improved switching circuit including a semiconductor device, the switching circuit being arranged so as to be readily adaptable for use in a wide range of applications.

Another object is to provide a novel switching circuit including a semiconductor device for use in applications where high power, rapid switching is involved and low leakage is desirable.

A further object is to provide a novel switching circuit which depends for its operation upon the sharp change in resistivity exhibited by certain types of semiconductive materials under predetermined conditions of temperature and applied electric field.

Semiconductors are known to have relatively high resistivities at room temperature as compared to metals. Most semiconductors display a marked increase in resistivity at low temperatures. This is particularly true for extrinsic types of semiconductors whose electrical properties depend upon the presence of impurity substances defined in the art as donor and acceptor impurities. At low temperatures, the electric charge carriers, holes or electrons, present in extrinsic types of semiconductors attain relatively high mobilities. Mobility is a parameter of a charge carrier and is defined as the ratio of the charge carrier drift velocity to an electric field applied to the semiconductor.

As described in my copending application, Serial Number 667,597, filed June 24, 1957, for Electrical Apparatus, in a condition of high mobility, a relatively small field, of the order of a few volts per centimeter, can impart enough energy to the electric charge carriers, which are electrons or holes, to cause impact ionization of the donor impurities in the case of electrons and of the acceptor impurities in the case of holes. The term impact ionization, as used here, refers to a phenomenon in which an atom of an impurity substance has been struck by a charge carrier, a hole or an electron, moving under the stimulus of an electric field, the atom thereby losing an electron or hole and becoming an ion.

When impact ionization occurs, the resistivity of the semiconductor sharply decreases due to the sudden increase in the flow of electric charge carriers. This sudden change in resistivity which is defined as the breakdown of the semiconductor results in a sharp change in the output current to input voltage characteristic of the semiconductor. The sudden decrease in resistivity causes a substantial increase in the flow of current through the semiconductor and over the electrical path in which the semiconductor is connected.

According to the invention, a switching circuit is provided in which a body of semiconductive material characterized by a sharp change in resistivity under predetermined conditions of temperature and applied electric field is connected in series with a source of unidirectional potential, an output circuit and a variable resistance device. The variable resistance device may be any one of many different known devices which function to vary their effective resistance in an electrical path according to a control signal applied to the device. The variable resistance device may be a photoconductive device responsive to a light signal, a vacuum tube or transistor device responsive to an electrical signal or any other known device which varies its resistance to current flow therethrough according to a control signal.

The temperature of the body of semiconductive material and the value of the voltage supplied by the source of unidirectional potential are determined so that, when the resistance of the variable resistance device approaches a minimum amount, a given level of impact ionization breakdown occurs within the semiconductor body. This is true because the decreased resistance presented by the variable resistance device in series with the semiconductor body results in a voltage being applied across the semiconductor body from the source of unidirectional potential of a sufficient level to exceed the breakdown point of the semiconductor body. The semiconductor body is characterized by a relatively low resistivity due to the flow of electric charge carriers therein, and the resulting increased current flow is applied to the output circuit connected in series with the semiconductor body.

The variable resistance device is arranged so that when the resistance thereof approaches a maximum amount, the voltage applied across the semiconductor body is of a level less than the voltage level required to cause the above-mentioned given level of impact ionization breakdown within the semiconductor body. The increased resistance presented by the variable resistance device in series with the semiconductor body effectively lowers the voltage applied across the semiconductor body from the source of unidirectional potential. The semiconductor body presents a relatively high resistance in the switching circuit, and a correspondingly smaller amount of current is applied to the output circuit.

By connecting a variable resistance device whose resistance varies between predetermined limits according to a control signal applied to the device in series with a body of semiconductive material characterized by a sharp change in resistivity under predetermined conditions of temperature and applied electric field, a switching circuit is provided which is readily adaptable for use in a wide range of applications where high power, rapid switching is desired. During periods in which the variable resistance device exhibits a relatively high resistance, the semiconductor body is also of a high resistance and a negligible amount of current is applied to the output circuit. During periods in which the resistance of the variable resistance device is decreased in an amount such that the voltage applied to the semiconductor body is sufficient to cause the impact ionization breakdown of the semiconductor body, a sudden and sharp increase in the amount of current applied to the output circuit occurs. The output circuit may be arranged to perform any desired function in response to the change in the amount of current applied thereto by the switching circuit, the amount of current being determined according to the control signal applied to the variable resistance device.

A more detailed description of the invention will now be given in connection with the accompanying drawing, in which.

Similar reference characters are applied to similar elements throughout the figures of the drawing.

Figure 1:
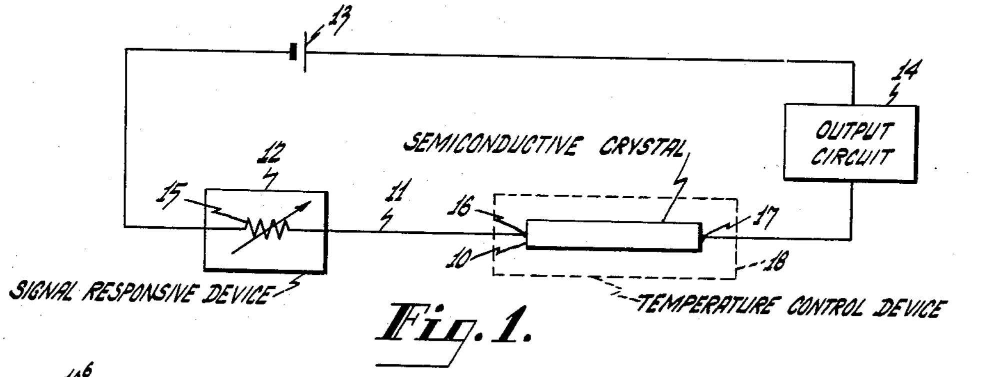
Figure 1 is a circuit diagram of one embodiment of a switching circuit constructed according to the invention.

Referring to Figure 1, a body of semiconductive material (or crystal) 10 is connected by means of a lead 11 in series with a signal responsive device 12, a source of unidirectional potential represented by a fixed battery 13 and an output circuit 14. The signal responsive device 12 is one which changes its effective resistance to the current flowing therethrough according to a control signal applied to the device 12. As such, the device 12 will hereinafter be referred to as a variable resistance device and is represented in Figure 1 as a variable resistor 15. The material of the semiconductor body 10 is one of the types which has a relatively steep resistivity versus temperature characteristic and in which the resistivity sharply changes under certain conditions of applied voltage and ambient temperature. Crystalline semiconductive materials such as N- or P-type germanium, N- or P-type silicon, P-type indium antimonide, and N- or P-type silicon-germanium alloys may be used.

The semiconductor body 10 includes impurity substances by which an excess of charge carriers can be made available to effect a change in the amount of current flow therethrough. Such a semiconductor body is referred to as being of the extrinsic type and is to be distinguished from the intrinsic type of semiconductor whose electrical properties are determined completely by the pure material of the semiconductor. A feature of the semiconductor body 10 is that it is of one type of semiconductive material only, as contrasted to other semiconductor devices such as transistors, junction diodes and point contact diodes which contain at least two different types of semiconductive materials.

Two types of impurities may be present in the extrinsic type of semiconductor body 10. If, for example, antimony, arsenic or phosphorus are present, an excess of electrons can be made free to move about within the semiconductor body 10. By virtue of the negative charges which the electrons bear, current will flow within the semiconductor. The impurities which result in an excess of free electrons are known as the donor impurities, and semiconductors containing such impurities are termed N-type.

If, on the other hand, indium, gallium or aluminum, for example, are present in the semiconductor body 10, each of these impurities can be made to create a positively charged region into which a free electron can flow. An excess of holes will be present, the acceptance of the electrons resulting in a flow of current. Impurities of this type are referred to as acceptor impurities, and semiconductors containing such impurities are termed P-type. Either the N-type or P-type of semiconductor can be made to conduct equally well in either direction. In the case where a semiconductor includes both N- and P-type regions within its structure as in transistor devices, current can flow readily in one direction only.

The semiconductor body 10 may be of any size and shape necessary to meet the requirements of a particular application, as will become apparent from the various embodiments of the invention to be described. By way of example only, it has been found practicable to use a semiconductor body 10 which is two millimeters wide by one millimeter deep and one centimeter (or ten millimeters) in length. In order to provide clarity in the drawing, the semiconductor body 10 has been shown in Figure 1 and in the other figures of the drawing greatly enlarged. The lead 11 is connected to opposite ends of the semiconductor body 10 at points 16, 17 located along the long dimension or longitudinal axis thereof by any of known techniques. The connections 16, 17 may be made by soldering to vapor deposited metal coatings on the semiconductor body 10 or to coatings formed of a cured silver paste.

The semiconductor body 10 is located in a low temperature environment indicated schematically by the dashed box 18. The box may represent a liquid helium cryostat or other means for maintaining the body 10 at a low temperature. Liquid helium liquefiers are commercially available as are double Dewar flasks which use liquid nitrogen in the outer Dewar and liquid helium in the inner Dewar, and lose less than 1% of their liquid helium per day. Where a material such as germanium is used as the semiconductor 10, an upper temperature limit of 25–32° Kelvin (K.) is feasible, although lower temperatures may be employed. For a semiconductive material such as silicon an upper temperature limit, which is approximately that of liquid nitrogen such as 80° K. may be used. However, liquid hydrogen or liquid helium temperatures are generally preferred. It is believed to be unnecessary to discuss in detail the means for maintaining the semiconductive material at low temperatures. These are described, in general, in the article entitled "Low Temperature Electronics" in the Proceedings of the IRE, volume 42, pages 408, 412, Feburary 1954, and in other publications.

Figure 2:
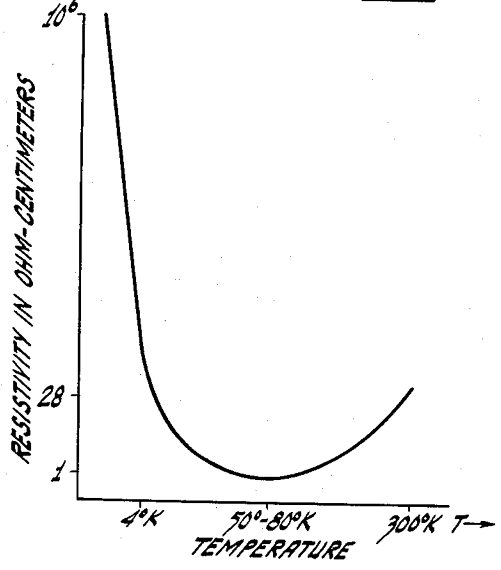
Figures 2, 3 and 4 are curves used in describing the operation of the embodiment given in Figure 1.

In describing the operation of the embodiment of the invention given in Figure 1, reference will be made to the curves given in Figures 2, 3 and 4. Figure 2 shows how the resistivity of a body of extrinsic type semiconductive material such as a particular sample of germanium having impurities therein varies with temperature in the presence of electric fields less than that required to produce impact ionization or the breakdown of the material. Absolute temperature T is plotted as the abcissa and the logarithm of the resistivity is plotted as the ordinate. At room temperature, this sample of germanium has a resistivity of approximately 28 ohm-centimeters. The resistivity reaches a minimum value at a temperature of about 50° to 80° K. (Kelvin) and then rises rapidly to approximately $10^6$ ohm-centimeters at about 4° K. Note that at very low temperatures only a relatively small increment in temperature is required to rapidly change the resistivity.

Figure 3:
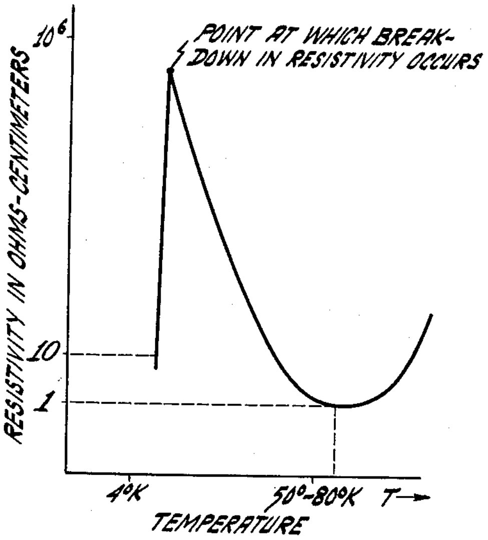

Figure 3 is a curve showing how the resistivity of the same sample of semiconductive material shown in Figure 2 varies with temperature when an electric field—say one produced by applying 10 volts from the battery 13 to the semiconductor body 10 in the embodiment of Figure 1 is applied to the sample after its temperature has been lowered to a value at which breakdown can occur. Down to a temperature of about 20° K. the curve is exactly the same as the one shown in Figure 2. However, when the temperature is reduced further, and, thereafter, the electric field is applied, the charge carriers, holes or electrons, attain such high mobilities from the electric field that they cause impact ionization of the donor or acceptor impurities. When this occurs, the high value of resistivity, which may be on the order of $10^6$ ohm-centimeters (the exact value depending on the temperature of the sample prior to breakdown), changes extremely sharply to a very low value of resistivity on the order of 10 ohm-centimeters. The sudden increase in free, excess electrons in the case of donor impurities or the sudden increase in free, excess holes in the case of acceptor impurities results in both cases in a sharp rise in the current flow through the semiconductor body 10.

Figure 4:
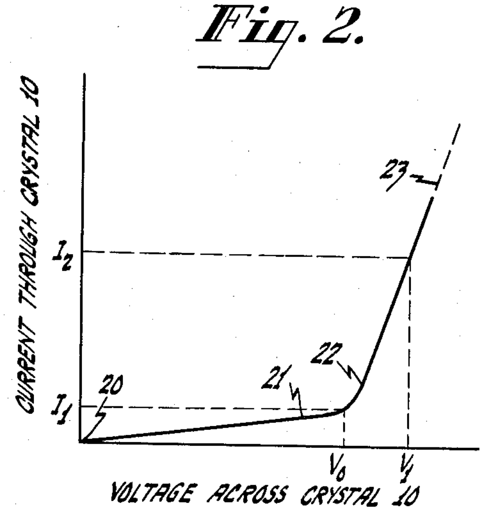

Figure 4 is a curve of the output current versus applied voltage characteristic of a typical semiconductor body 10, demonstrating the effect of impact ionization and the resulting sudden decrease in resistivity. Assume that the semiconductor body 10 of Figure 1 is made of germanium with either donor or acceptor impurities and that the temperature maintained by the device 18 is on the order of 10° K. During the portion 20, 21 of the curve, the resistivity of the semiconductor body 10 is high. A relatively large change of input voltage applied to the semiconductor body 10 under these conditions causes practically no change in the output current of the body 10. However, the resistivity changes sharply upon the breakdown of the semiconductor body 10 when the input voltage equals or exceeds a value $V_0$, and a sharp change in the output current occurs between the points 21, 22 on the curve. The remainder of the curve between points 22, 23 is extremely steep so that a relatively small increase in voltage beyond the value $V_0$ (during the portion 22, 23 of the curve) results in a large increase in the output current.

In the operation of the embodiment of the invention given in Figure 1, the temperature of the semiconductor body 10 is adjusted by means of the device 18 to a point such that the semiconductor body 10 exhibits high resistivity in the manner shown in the curve of Figure 2. The battery 13 is adjusted to supply a predetermined fixed voltage so that, in the absence of the variable resistance device 12 (when the variable resistance device 12 equals zero resistance), the voltage supplied by the battery 13 is greater than that required to cause the breakdown of the semiconductive body 10.

Referring to Figure 4, it has been assumed that a voltage $V_0$ is required to cause the breakdown in the semiconductor body 10. The battery 13 is set to supply, for example, a voltage $V_1$ which is greater than the voltage $V_0$ or, in other words, beyond the breakdown point of the semiconductor body 10. In the absence of the variable resistance device 12 or during intervals in which the resistance of the variable resistance device 12 is zero, the semiconductor body 10 is, therefore, in a state of relatively low resistivity due to the occurrence of impact ionization. The presence of an excess of charge carriers in the semiconductor body 10 permits a relatively large current flow $I_2$ through the semiconductor body 10. While the battery 13 has been assumed to supply a voltage of value $V_1$, the voltage supplied by the battery 13 may be of any amount sufficient to cause impact ionization within the semiconductor body 10.

As mentioned, the variable resistance device 12 is any one of a number of known devices which normally exhibit a relatively high resistance in the absence of a control signal applied thereto. That is, the device 12 is a current conducting device which in the absence of a proper control signal applied thereto remains substantially non-conducting. The series combination of the device 12 and the semiconductor body 10 may be considered to be a voltage dividing network. The total voltage across the series combination must at all times equal the voltage across the device 12 plus the voltage across the semiconductor body 10. If the resistance of the device 12 is high, a relatively large voltage appears across the device 12. The difference voltage between the total voltage supplied by the battery 13 and the voltage across the device 12 appears across the semiconductor body 10. The value of the voltage supplied by the battery 13 and the resistance of the device 12 in standby condition are determined in relation to one another so that, in the absence of a control signal applied to the device 12, the resistance of the device 12 is sufficient to reduce the voltage applied across the semiconductor body 10 to a desired level.

For example, suppose that the device 12 is such that, in the absence of a control signal applied thereto, the resistance thereof is sufficient to cause a voltage of the value $V_0$ shown in Figure 4 to be applied across the semiconductor body 10. A current of the value $I_1$ flows through the output circuit 14. If the resistance of the device 12 is now decreased to a minimum value according to a given parameter of a control signal applied to the device 12 with the total voltage supplied by the battery 13 remaining the same, it follows directly from the voltage dividing network that the voltage across the semiconductor body 10 will increase. If the resistance of the device 12 is changed so that the new operating point of the semiconductor body 10 is at the voltage $V_1$, for example, the current flow through the output circuit 14 becomes of the value $I_2$. For a relatively small increase in the voltage applied to the semiconductor body 10, a relatively large increase in the current flow through the output circuit 14 occurs. As the resistance of the device 12 is varied between the limits thereof according to the given parameter of the control signal applied thereto, the voltage appearing across the semiconductor body 10 varies between the values $V_0$ and $V_1$ in a corresponding manner. The semiconductor body 10 is operated at different levels of impact ionization breakdown, and the current flow through the output circuit 14 will vary in amount between $I_1$ and $I_2$ according to the control signal applied to the device 12.

While it has been assumed in the above discussion that the device 12 is such that the voltage appearing across the semiconductor body 10 is at all times greater in amount than the voltage $V_0$ required to cause the impact ionization breakdown of the semiconductor body 10, the invention is not limited to this particular operation. The device 12 may function such that, in the absence of a control signal applied thereto, the voltage appearing across the semiconductor body 10 due to the resistance of device 12 is less than that required to cause the breakdown of the semiconductor body 10. The semiconductor body 10 is operated at a corresponding point in the portion 20, 21 of the curve given in Figure 4. Each time the resistance of the device 12 is lowered in response to the given parameter of the control signal applied thereto sufficient to cause the voltage across the semiconductor body 10 to exceed the breakdown voltage $V_0$, impact ionization occurs and a sudden increase of the current flow through the output circuit 14 results. The current flow through the output circuit 14 increases by an amount determined according to the difference between the voltage appearing across the semiconductor body 10 and the breakdown voltage $V_0$, and so on. The value of the voltage supplied by the battery 13 and the range of resistance values over which the device 12 is variable can be adjusted in relation to the input voltage to output current characteristic curve of the material used in the semiconductor body 10 to meet the requirements of a particular application.

The output circuit 14 may be constructed in any known manner according to the function to be performed by the switching circuit. For example, the output circuit 14 may include an alarm device such as a bell or light which is energized upon the current flow through the output circuit 14 exceeding a predetermined value. The output circuit 14 may include a transformer having a primary winding connected in series with the semiconductor body 10 and a secondary winding connected to a desired utilization circuit.

Figure 5:
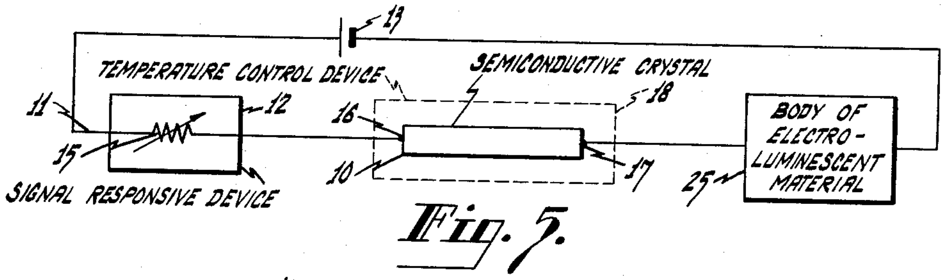
Figure 5 is a circuit diagram of an embodiment of the invention in which the output circuit thereof includes a body of electroluminescent material.

Figure 5 shows an application of the invention in which the output circuit 14 includes a body of electroluminescent material 25 connected in series with the semiconductor body 10. Each time the current flow through the body 25 increases an amount necessary to energize the material of the body 25, a visible indication is provided of the condition. Since the impact ionization breakdown of the semiconductor body 10 and therefore the amount of current fed to the body 25 is determined according to the control signal applied to the variable resistance device 12, the intensity of the light emitted by the body 25 will likewise be determined according to the control signal applied to the device 12. An arrangement of the type shown in Figure 5 may be used in any application where a visible presentation having an intensity that is rapidly varied in time according to one or more control signals is desired.

Figure 6:
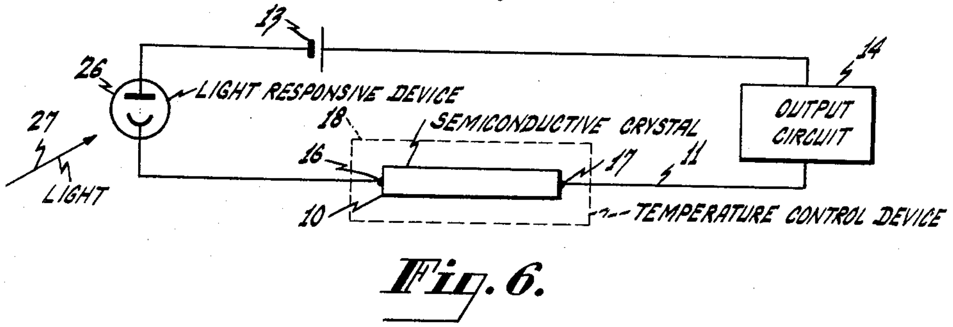
Figure 6 is a circuit diagram of another embodiment of the invention wherein the variable resistance device is a light responsive device.

Referring to Figure 6, there is shown a particular application of the invention in which the variable resistance device 12 shown in Figure 1 is a photoconductive device responsive to light. While a conventional photocell 26 is shown, a photoconductive semiconductor or any other device which varies its resistance according to light applied thereto may be used. As understood in the art, the photocell 26 in the absence of light applied thereto is a substantially non-conducting device and presents a relatively high resistance in series with the semiconductor body 10. The photocell 26 becomes conducting and thereby varies its resistance according to the amplitude of the light applied thereto in the direction of the arrow 27 from a suitable source, not shown.

As the resistance of the photocell 26 varies according to the amplitude of the light applied thereto, the voltage appearing across the semiconductor body 10 varies in an inverse relationship. That is, for maximum amplitude of the light input signal, the photocell 26 conducts most heavily and the effective resistance of the photocell 26 is at a minimum value. As a result, the voltage appearing across the semiconductor body 10 approaches in value the voltage supplied by the battery 13. The resulting level of the impact ionization breakdown within the semiconductor body 10 causes a correspondingly large amount of current flow through the output circuit 14. For a minimum amplitude of the light input signal, the photocell 26 conducts less heavily and the effective resistance in series with the semiconductor body 10 is increased a corresponding amount. A lower level or no impact ionization breakdown occurs within the semiconductor body 10, resulting in a correspondingly smaller amount of current flow through the output circuit 14. The photocell 26 may be of a type responsive to visible light or may be of a type which is responsive only to a given range of wavelengths of invisible light as, for example, within the infra-red region of the frequency spectrum.

Figures 7, 8:
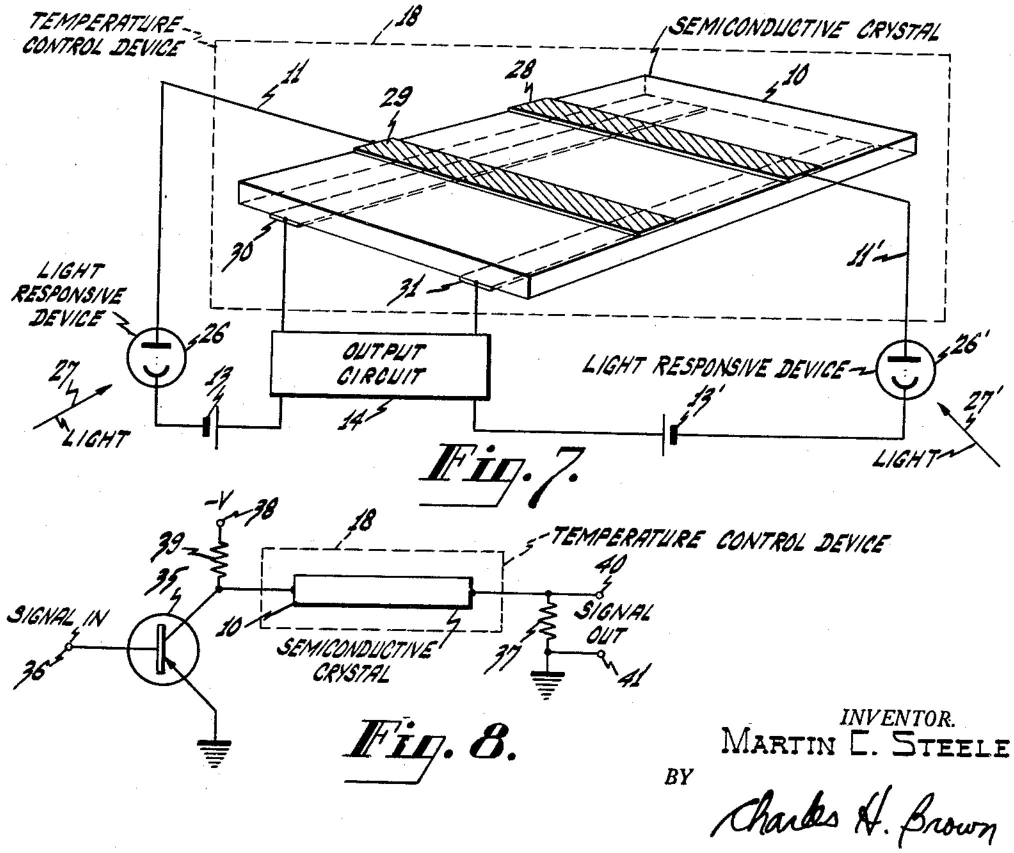
Figure 7 depicts the application of the embodiment given in Figure 6 to a matrix arrangement.
Figure 8 is a circuit diagram showing another embodiment of the invention in which the variable resistance device is a transistor responsive to an electrical signal applied thereto.

An application of the particular embodiment of the invention shown in Figure 6 to a matrix arrangement is given in Figure 7. A first pair of strips of conducting material 28, 29 are arranged in parallel across one surface of the semiconductor body 10. A second pair of strips of conducting material 30, 31 are arranged in parallel across the opposite surface of the semiconductor body 10 at right angles to the first pair of strips 28, 29. The strips 28, 29, 30 and 31 may be mounted on the body 10 by a vapor depositing technique, soldering or by other known procedures. A first electrical circuit is completed including lead 11, photocell 26, battery 13, output circuit 14, strip 30, semiconductor body 10 and strip 29. A second electrical path is also completed including lead 11', photocell 26', battery 13', output circuit 14, strip 31, semiconductor body 10 and strip 28.

In operation, a light 27 from, for example, a single light source, not shown, may be selectively directed at the photocells 26, 26'. When the light is applied to the photocell 26 such that the photocell 26 conducts, causing the voltage appearing across the area of the semiconductor body 10 between strips 29 and 30 to increase beyond the breakdown point of the semiconductor body 10, a given level of impact ionization breakdown occurs in the area of the semiconductor body 10. A correspondingly increased current flow occurs over the electrical path including the photocell 26 and through the output circuit 14. In much the same manner, when the light 27 is directed at the photocell 26', causing the voltage appearing across the area of the semiconductor body 10 between strips 28 and 31 to increase beyond the breakdown point of the semiconductor body 10, a given level of impact ionization breakdown occurs in that area of the semiconductor body 10. A correspondingly increased current flow occurs over the electrical path including the photocell 26' and through the output circuit 14. Instead of a single light source, separate light sources could, of course, be used to operate the respective photocells 26, 26'.

The arrangement of the invention given in Figure 7 is readily adaptable for use in various coding techniques such as are used in computer applications. While only two switching circuits are shown, any number may be used by providing the necessary number of strips on the surface areas of the semiconductor body 10, and so on. In mounting the strips, it is only necessary that they be spaced sufficiently apart along the surface area to prevent interaction or cross-talk therebetween. That is, the strips need to be spaced so that each area of the semiconductor body 10 subjected to impact ionization breakdown is surrounded by an area of the mass of the semiconductor body 10 acting in effect as an insulator. Since the impact ionization breakdown is substantially limited to the area between the pair of strips included in an electrical path, a relatively large number of strips may be mounted on a given semiconductor body. A correspondingly large number of switching circuits may, therefore, be combined by means of a single semiconductor body to produce a coding or other desired operation. As mentioned in connection with Figure 6, while photocells 26, 26' are shown in Figure 7, a photoconductive semiconductor or other light responsive device may be used instead. Further, it is evident that instead of the photocells 26 and 26', any variable resistance device whose resistance varies according to a control signal applied thereto may be used.

Figure 8 shows a further embodiment of the invention in which the variable resistance device 12 shown in Figure 1 is in the form of a transistor device. A transistor device 35 such as a P-N-P junction transistor is shown. When the transistor 35 is cut-off or non-conducting, a reduced voltage will appear across the semiconductor body 10. Upon a negative going signal being applied to the base electrode of the transistor 35 via an input terminal 36 from a suitable source, not shown, the transistor 35 will conduct. When the transistor 35 is conducting sufficiently heavily in response to the control signal to cause the voltage supplied by a source of unidirectional potential represented by terminal 38 via resistor 39 and appearing across the semiconductor body 10 to exceed the breakdown point of the semiconductor body 10, impact ionization breakdown within the semiconductor body occurs. In other words, the voltage applied to the semiconductor body 10 is made to go sufficiently positive with respect to ground to cause the impact ionization breakdown to occur. The sharp change in resistivity of the semiconductor body 10 results in a correspondingly increased current flow through the semiconductor body 10 and through an output resistor 37. A suitable utilization circuit, not shown, may be connected across the output resistor 37 via terminals 40, 41 and arranged to perform a desired function in response to the change in current flow, resulting from the impact ionization breakdown of the semiconductor body 10.

While certain specific embodiments of the invention have been illustrated, the invention is not to be considered as limited thereto. The switching circuit of the invention may be used in connection with other known variable resistance devices. For example, the variable resistance device 12 may be a device whose resistance varies according to the temperature thereof. Such devices are known as thermistors. Instead of a heat responsive device, a device responsive to other types of radiations such as a Gieger tube may be used. In certain applications, a second semiconductor body which exhibits a sharp change in resistivity due to impact ionization may be used for the variable resistance device 12. Various arrangements for controlling the impact ionization breakdown and, therefore, the resistivity of such a semiconductor body according to a control signal applied thereto are presented in my copending application, Serial Number 667,597, filed June 24, 1957, for Electrical Apparatus.

A switching circuit is provided by the invention which is readily adaptable for use in a wide range of applications. Since the variable resistance device 12 may be located at a point remote from the semiconductor body 10, the use of the invention is not necessarily limited by the existence of the temperature control device 18. Because of the sharp change in resistivity exhibited by the semiconductor body 10, the switching circuit is useful where rapid switching in response to a given condition is desired. The switching time is limited (other than by the limitations involved in the operation of the variable resistance device 12) by the time needed to initiate breakdown in the semiconductor body 10 which is apparently less than $10^{-9}$ seconds. The construction and operation of the semiconductor body 10 makes the switching circuit of the invention particularly suitable for use in applications where reliability and greater efficiency of operation are desired. For example, the semiconductor body 10 is by the method of use described mechanically stronger than existing crystal diodes and can therefore better withstand shocks. Further, the semiconductor body 10 possesses a long lifetime as compared, for example, to vacuum tube devices or point contact diodes.

What is claimed is:

1. A switching circuit comprising, in combination, a body of material which exhibits a sharp change in resistivity due to impact ionization under predetermined conditions of temperature and applied electric field, means for adjusting the temperature of said body to said predetermined temperature condition, a source of unidirectional potential, a device whose resistance is made to vary in value over a given range of resistance values according to a control signal applied to said device, and means to connect said source, said device and said body in series to complete an electrical path through said body.

2. A switching circuit comprising, in combination, a body of material which exhibits a sharp change in resistivity due to impact ionization under predetermined conditions of temperature and applied voltage, means for adjusting the temperature of said body to said predetermined temperature condition, a source of unidirectional potential connected to said body and arranged to supply a voltage to said body sufficient to cause said sharp change in resistivity, and variable impedance means connected between said source and said body and arranged to vary the voltage supplied by said source to said body according to a control signal applied to said last-mentioned means.

3. A switching circuit comprising, in combination, a body of material which exhibits a sharp change in resistivity due to impact ionization under predetermined conditions of temperature and applied electric field, means for adjusting the temperature of said body to said predetermined temperature condition, a source of unidirectional potential of a value sufficiently large to cause impact ionization within said body, a device whose resistance is made to vary in value over a given range of resistance values according to a control signal applied to said device, and means to connect said source, said device and said body in series to complete an electrical path through said body, the value of potential supplied by said source and of the resistance of said device being so related that a change in resistance of said device in one direction will cause the application of a potential to said body at a level to produce said impact ionization.

4. A switching circuit comprising, in combination, a body of material which exhibits a sharp change in resistivity due to impact ionization under predetermined conditions of temperature and applied voltage, means for adjusting the temperature of said body to said predetermined temperature condition, a source of unidirectional potential connected to said body and arranged to supply a voltage to said body, and variable impedance means responsive to a control signal to vary the voltage supplied by said source to said body sufficient to cause said sharp change in resistivity.

5. A switching circuit comprising, in combination, a body of semiconductor material which exhibits a sharp change in resistivity due to impact ionization under predetermined conditions of temperature and applied voltage, means for adjusting the temperature of said body to said predetermined temperature condition, a source of unidirectional potential connected across said body and arranged to supply a voltage to said body sufficient to cause said sharp change in resistivity, and a device connected between said source and said body having an electrical current resistance which is made to vary according to a control signal applied to said device, said device being operated to vary the voltage applied by said source to said body according to said control signal.

6. A switching circuit comprising, in combination, a body of a single type of semiconductor material having impurities therein of acceptor or donor type to change the electrical properties of said material and which exhibits a sharp change in resistivity due to impact ionization under predetermined conditions of temperature and applied voltage, means for adjusting the temperature of said body to said predetermined temperature condition, a source of unidirectional potential connected to said body and arranged to supply a given voltage to said body sufficient to cause said sharp change in resistivity, and a variable resistance device connected between said source and said body and arranged to vary the voltage supplied from said source to said body according to a control signal applied to said device.

7. A switching circuit as claimed in claim 6 and wherein said device is a current conducting device responsive to an electrical control signal.

8. A switching circuit comprising, in combination, a body of semiconductor material which exhibits a sharp change in resistivity due to impact ionization under predetermined conditions of temperature and applied electric field, means to adjust the temperature of said body to said predetermined temperature condition, a source of unidirectional potential, a variable electric current resistance device whose resistance is made to vary according to a control signal applied to said device, and means for connecting said source, said body and said device in series to complete an electrical path through said body.

9. A switching circuit comprising, in combination, a body of a single type of semiconductor material having impurities therein of acceptor or donor type to change the electrical properties of said material and which exhibits a sharp change in resistivity due to impact ionization under predetermined conditions of temperature and applied voltage, means to adjust the temperature of said body to said predetermined temperature condition, a source of unidirectional potential arranged to supply a voltage sufficient in value to cause said sharp change in resistivity, a variable electric current resistance device whose resistance is made to vary over a range of resistance values according to a control signal applied to said device, and means for connecting said source, said device and said body in series to complete an electrical path through said body, whereby the value of the voltage supplied by said source to said body is varied by the change in the resistance value of said device according to said control signal.

10. A switching circuit as claimed in claim 9 and wherein said device includes a transistor device responsive to an electrical control signal.

11. A switching circuit as claimed in claim 9 and wherein said body of material is constructed as a thin wafer having dimensions of the order of two millimeters wide by one millimeter deep and ten millimeters in length.

12. A switching circuit comprising, in combination, a body of a single type of semiconductive material having impurities therein of acceptor or donor type to change the electrical properties of said material and which exhibits a sharp change in resistivity due to impact ionization under predetermined conditions of temperature and applied voltage, means for adjusting the temperature of said body to said predetermined temperature condition, a source of unidirectional potential connected to said body and arranged to supply a voltage of given value to said body sufficient to cause said sharp change in resistivity, a variable electric current resistance device connected in series between said source and said body and arranged to vary the value of the voltage applied to said body from said source between said given value and a predetermined lower voltage value as the resistance value of said device is made to vary between a maximum and minimum value according to a control signal applied to said device, said device being operated each time the resistance value of said device is at said minimum value in response to said control signal to cause a voltage of said given value to be applied to said body from said source to produce said sharp change in the resistivity of said material.

13. A switching circuit as claimed in claim 12 and wherein a second body of electroluminescent material is connected in series with said body, said source and said device, said second body being energized each time said sharp change in resistivity occurs.

14. A switching circuit as claimed in claim 12 and wherein said type of semiconductor material is selected from the group consisting of N- and P-type germanium, N- and P-type silicon, P-type antimonide and N- and P-type germanium-silicon alloys.

15. A switching circuit as claimed in claim 12 and wherein said source is a direct current battery.

16. In combination, a body of a single type of semiconductor material having impurities therein of acceptor or donor type to change the electrical properties of said material and which exhibits a sharp change in resistivity due to impact ionization under predetermined conditions of temperature and applied voltage, means for adjusting the temperature of said body to said predetermined temperature condition, a source of unidirectional potential arranged to supply a voltage of a given value sufficient to cause said sharp change in resistivity in said body, a resistance device whose resistance value is varied over a range of resistance values according to a control signal applied to said device, a second body of electroluminescent material, and means for connecting said source, said device, said first body and said second body in series to complete an electrical path through said first body, said device being operated each time the resistance value thereof is in response to said control signal decreased to a predetermined resistance value to permit a voltage of said given value to be applied from said source to said body, whereby said sharp change in resistivity occurs each time the voltage of said given value is applied to said first body and an increased current flow through said first body and over said path thereby results which is sufficient in amount to energize said second body.

17. A switching circuit comprising, in combination, a body of a single type of semiconductor material having impurities therein of acceptor or donor type to change the electrical properties of said material and which exhibits a sharp change in resistivity due to impact ionization under predetermined conditions of temperature and applied voltage, means for adjusting the temperature of said body to said predetermined temperature condition, a source of unidirectional potential connected to said body and arranged to supply a given voltage to said body sufficient to cause said sharp change in resistivity, and a photoconductive device connected between said source and said body and arranged to vary the voltage supplied from said source to said body in response to a light control signal applied to said device.

18. A switching circuit comprising, in combination, a body of a single type of semiconductor material having impurities therein of acceptor or donor type to change the electrical properties of said material and which exhibits a sharp change in resistivity due to impact ionization under predetermined conditions of temperature and applied voltage, means to adjust the temperature of said body to said predetermined temperature condition, a source of unidirectional potential arranged to supply a voltage sufficient in value to cause said sharp change in resistivity, a photoconductive device whose resistance is made to vary over a range of resistance values in response to a light control signal applied to said device, and means for connecting said source, said device and said body in series to complete an electrical path through said body, whereby the value of the voltage supplied by said source to said body is varied by the change in the resistance value of said device according to said control signal.

19. A switching circuit comprising in combination, a body of material which exhibits a sharp change in resistivity due to impact ionization under predetermined conditions of temperature and applied electric field, means for adjusting the temperature of said body to said predetermined temperature condition, means to apply a unidirectional potential to said body sufficient in value to cause said sharp change in resistivity, and means including an adjustable impedance element responsive to a control signal to vary the unidirectional potential applied to said body according to said control signal.

References Cited in the file of this patent

UNITED STATES PATENTS

| | | |
|---|---|---|
| 2,725,474 | Ericsson et al. | Nov. 25, 1955 |
| 2,832,897 | Buck | Apr. 29, 1958 |